(12) United States Patent
Hirai

(10) Patent No.: US 8,040,191 B2
(45) Date of Patent: Oct. 18, 2011

(54) PLL CIRCUIT WITH VCO GAIN CONTROL

(75) Inventor: Yoshitaka Hirai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 38 days.

(21) Appl. No.: 12/751,395

(22) Filed: Mar. 31, 2010

(65) Prior Publication Data

US 2010/0271141 A1 Oct. 28, 2010

(30) Foreign Application Priority Data

Apr. 23, 2009 (JP) ................................. 2009-104830
Jan. 20, 2010 (JP) ................................. 2010-010054

(51) Int. Cl.
*H03L 7/00* (2006.01)
(52) U.S. Cl. ............... 331/16; 331/17; 331/34; 327/156
(58) Field of Classification Search .................... 331/16, 331/17, 34; 327/156
See application file for complete search history.

(56) References Cited

U.S. PATENT DOCUMENTS

| 6,680,632 | B1 | 1/2004 | Meyers et al. |
| 7,009,456 | B2 * | 3/2006 | Jasa et al. .................... 331/16 |
| 7,777,577 | B2 * | 8/2010 | Jennings et al. ............ 331/17 |
| 2008/0042759 | A1 | 2/2008 | Watanabe |

FOREIGN PATENT DOCUMENTS

JP 2008-48320 A 2/2008

\* cited by examiner

*Primary Examiner* — Arnold Kinkead
(74) *Attorney, Agent, or Firm* — Foley & Lardner LLP

(57) ABSTRACT

A PLL circuit includes first and second charge pump circuits controlling an output voltage according to an output signal of a phase comparator, a first filter filtering out predetermined frequency component included in a signal generated according to current output from the first charge pump circuit, and outputting the signal as a first voltage signal, a second filter inputting a current output from the second charge pump circuit and outputting a predetermined constant voltage as a second voltage signal, a voltage control unit outputting a third voltage signal according to a comparison result between the first voltage signal output from the first filter and a reference voltage signal, and a voltage controlled oscillator that has a first low gain property, a second low gain property, and a high gain property, and is controlled by the first to third voltage signals to generate an oscillating frequency.

15 Claims, 14 Drawing Sheets

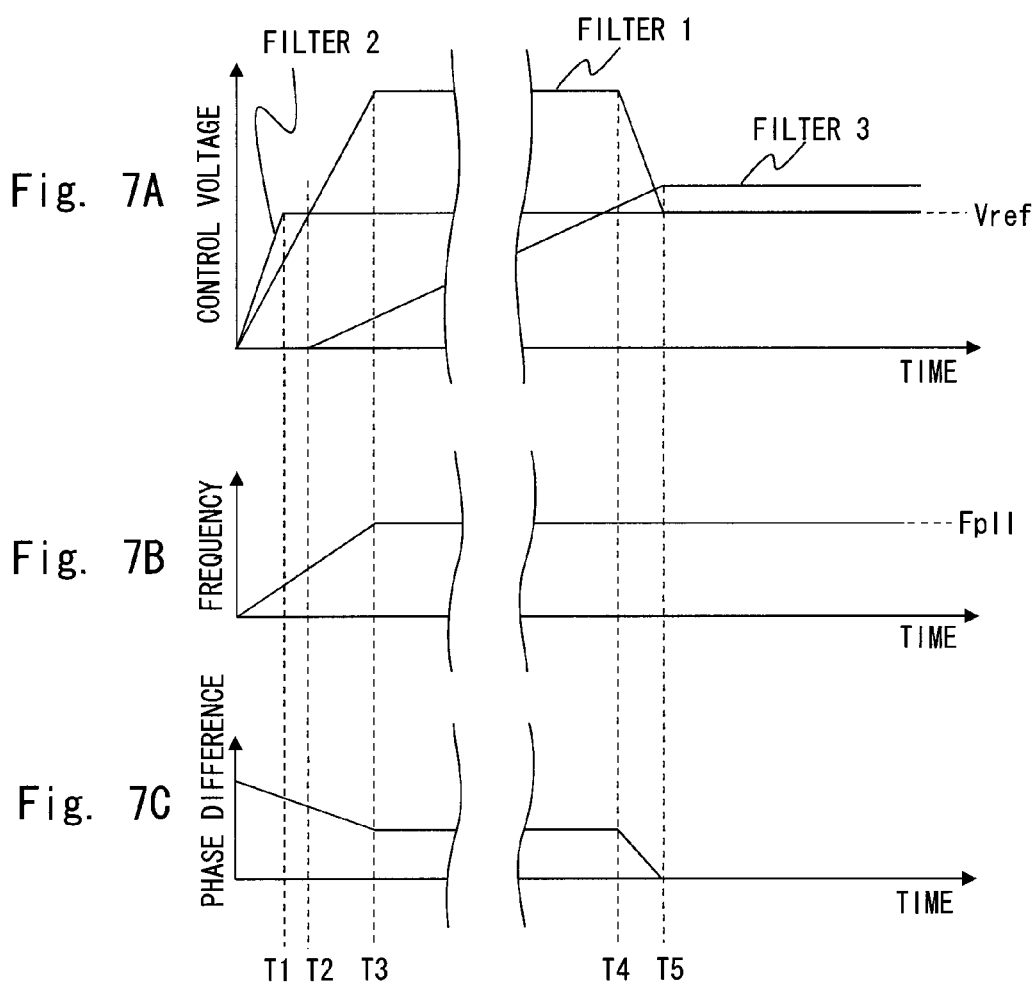

US 8,040,191 B2

PLL CIRCUIT WITH VCO GAIN CONTROL

INCORPORATION BY REFERENCE

This application is based upon and claims the benefit of priority from Japanese patent application No. 2009-104830, filed on Apr. 23, 2009 and Japanese patent application No. 2010-010054, filed on Jan. 20, 2010, the disclosure of which is incorporated herein in its entirety by reference.

BACKGROUND

1. Field of the Invention

The present invention relates to a PLL circuit, and particularly to a PLL circuit provided with a voltage controlled oscillator (VCO) having a low gain input and a high gain input.

2. Description of Related Art

In recent years, a PLL (Phase Locked Loop) circuit is often used as an oscillator circuit mounted on a semiconductor device. A PLL circuit controls an oscillating frequency of an output signal so that phases of a reference signal and the output signal synchronize.

FIG. 12 is a block diagram illustrating a PLL circuit disclosed in U.S. Pat. No. 6,680,632. In FIG. 12, a PLL circuit 100 includes dividers 102 and 112, a phase comparator 104, a charge pump circuit 106, a low pass filter 108, a control circuit 130 provided with buffers 114 and 116, and a voltage controlled oscillator (VCO) 110.

The phase comparator 104 compares a signal obtained by dividing a frequency of a reference signal (REF) by the divider 102 with a signal obtained by dividing a frequency of an output signal (CLK) of the PLL circuit 100 by the divider 112, and then outputs a signal for controlling the charge pump circuit 106. The charge pump circuit 106 outputs a current controlled to be in an inflow direction or an outflow direction according to the output signal of the phase comparator 104. The low pass filter 108 inputs the signal from the charge pump circuit, and removes high frequency noise included in the signal. The signal with removed high frequency noise is output to a low gain input of the voltage controlled oscillator 110. The signal with removed high frequency noise is output to a high gain input of the voltage controlled oscillator 110 via the control circuit 130 which is provided with the buffer 114 and the filter 116.

The buffer 114 compares an output of the low pass filter 108 with a MID_VCO signal, and controls so that the output of the low pass filter 108 is to be the same as the MID_VCO signal. The voltage controlled oscillator 110 of the PLL circuit 100 can operate simultaneously in low gain mode and high gain mode.

FIG. 14 is a block diagram illustrating a PLL circuit disclosed in Japanese Unexamined Patent Application Publication No. 2008-48320. As illustrated in FIG. 14, the PLL circuit includes dividers 210, 211, and 221, a phase comparator 212, a first charge pump circuit 213, an integrating filter 214, a first voltage-current converting circuit 215, a second charge pump circuit 216, a ripple filter 217, a second voltage-current converting circuit 218, a reference voltage generation circuit 219, and a current controlled oscillator 220.

The PLL circuit illustrated in FIG. 14 divides a frequency of a reference signal Fin by the divider 210. Further, the output signal Fout is divided with the divider 211. Then, a phase of an output signal of the divider 210 is compared with that of the divider 211 by the phase comparator 212. Then, the phase comparator 212 generates a voltage-up signal UP and a voltage-down signal DN based on the phase difference therebetween. The first charge pump circuit 213 and the second charge pump circuit 216 output a current based on a difference between the pulse width of the voltage-up signal UP and the pulse width of the voltage-down signal DN.

The current output from the first charge pump circuit 213 is converted into voltage by a capacitor C1 of the integrating filter 214. At this time, the integrating filter 214 removes a high frequency noise generated by the operation of the first charge pump circuit 213.

On the other hand, the current output from the second charge pump circuit 216 is converted into voltage via the ripple filter 217. The ripple filter 217 reduces ripple noise. Then, the voltage with reduced level of the ripple noise is input to the second voltage-current converting circuit 218. The second voltage-current converting circuit 218 compares the reference voltage generated in the reference voltage generation circuit 219 with the voltage input via the ripple filter 217. Then, the second voltage-current converting circuit 218 outputs a current according to the comparison result of the two voltages.

The output of the first voltage-current converting circuit 215 and the output of the second voltage-current converting circuit 218 are connected to each other, and then input to the current controlled oscillator 220. That is, the current input to the current controlled oscillator 220 is the addition of the output current of the first voltage-current converting circuit 215 and the output current of the voltage-current converting circuit 218. The current controlled oscillator 220 controls the oscillation frequency of the output signal based on the current generated according to such voltage. Then, the divider 221 divides the frequency of the output signal of the current controlled oscillator 220 to generate the output signal Fout. Further, the output Fout is fed back, and the phases of the output signal Fout and the reference signal Fin are compared. Then the phase of the output signal Fout is synchronized with the phase of the reference signal Fin.

Therefore, the PLL circuit illustrated in FIG. 14 can operate the ripple filter 217 and the integrating filter 214 with different currents. Thus, the current supplied to the integrating filter 214 can be smaller than the current supplied to the ripple filter 217. Moreover, the capacitance value of the capacitor C1 of the integrating filter can be reduced based on the ratio α between the current supplied to the integrating filter 214 and the ripple filter 217.

SUMMARY

However, in the PLL circuit disclosed in U.S. Pat. No. 6,680,632 illustrated in FIG. 12, a passive filter constituted of a resistor R and a capacitance C as the one illustrated in FIG. 13 is generally used as the low pass filter 108. Then, the present inventor has found a problem that the PLL circuit disclosed in U.S. Pat. No. 6,680,632 needs to increase the value of the capacitance constituting the filter 108 in order to remove the noise generated in the charge pump circuit 106 and ensure the stability.

On the other hand, the PLL circuit disclosed in Japanese Unexamined Patent Application Publication No. 2008-48320 is provided with the first charge pump circuit 213 and the second charge pump circuit 216, in order to operate the ripple filter 217 and the integrating filter 214 with different currents. This reduces the capacitance value of the capacitor C1, and also the circuit area. However, the present inventor has found a problem in the PLL circuit disclosed in Japanese Unexamined Patent Application Publication No. 2008-48320, as the voltage behavior to a change in the frequency and the circuit configuration are different between the path that passes through the first charge pump circuit 213, the integrating filter 214, and the voltage-current converting circuit 215, and the path that passes through the second charge pump circuit 216, the ripple filter 217, and the second voltage-current converting circuit 218, it is difficult to match the gain of the two paths of the current controlled oscillator. That is, in order to operate as a PLL circuit, it is desirable to realize the circuit with the same circuit configuration so as to be able to easily control the gains of both paths.

An exemplary aspect of the present invention is a PLL circuit that includes first and second charge pump circuits that control an output voltage according to an output signal of a phase comparator, a first filter that filters out a predetermined frequency component included in a signal generated according to a current output from the first charge pump circuit, and outputs the signal as a first voltage signal, a second filter that inputs a current output from the second charge pump circuit and outputs a predetermined constant voltage as a second voltage signal, a voltage control unit that outputs a third voltage signal according to a comparison result between the first voltage signal and a reference voltage signal, where the first voltage signal is output from the first filter, and a voltage controlled oscillator that has a first low gain property, a second low gain property, and a high gain property, and is controlled by the first voltage signal with the first low gain property, by the second voltage signal with the second low gain property, and by the third voltage signal with the high gain property, to generate an oscillating frequency according to the first to third voltage signals. The PLL circuit feeds back an output signal of the voltage controlled oscillator to the phase comparator.

The PLL circuit according to the present invention having such configuration enables to suppress the gain of the voltage controlled oscillator while the PLL circuit is locked, thereby reducing the noise sensibility of the voltage controlled oscillator. Moreover, by the first and second charge pump circuits provided to operate the first and second filters with different currents, the capacitance value of the capacitor constituting the first filter can be reduced and therefore reducing the area of the PLL circuit. Further, as the output of the second filter is set to a predetermined constant voltage, the voltage controlled oscillator can operate stably.

The present invention provides a PLL circuit that reduces the circuit area of the loop filter, stabilizes the operation of the voltage controlled oscillator, and reduces the noise sensibility.

BRIEF DESCRIPTION OF THE DRAWINGS

The above and other exemplary aspects, advantages and features will be more apparent from the following description of certain exemplary embodiments taken in conjunction with the accompanying drawings, in which:

FIGS. 7A, 7B, and 7C explain an operation of the PLL circuit according to the first exemplary embodiment, FIG. 7A illustrates the relationship between time and a control voltage, FIG. 7B illustrates the relationship between time and a frequency, and FIG. 7C illustrates the relationship between time and a phase difference;

FIG. 8A illustrates the relationship between a control voltage and an oscillating frequency of the voltage controlled oscillator, and FIG. 8B illustrates the relationship between a frequency of an output signal of each filter and an open loop gain;

DETAILED DESCRIPTION OF THE EXEMPLARY EMBODIMENTS

First Exemplary Embodiment

A first exemplary embodiment of the present invention is explained with reference to the drawings hereinafter.

Figure 1:
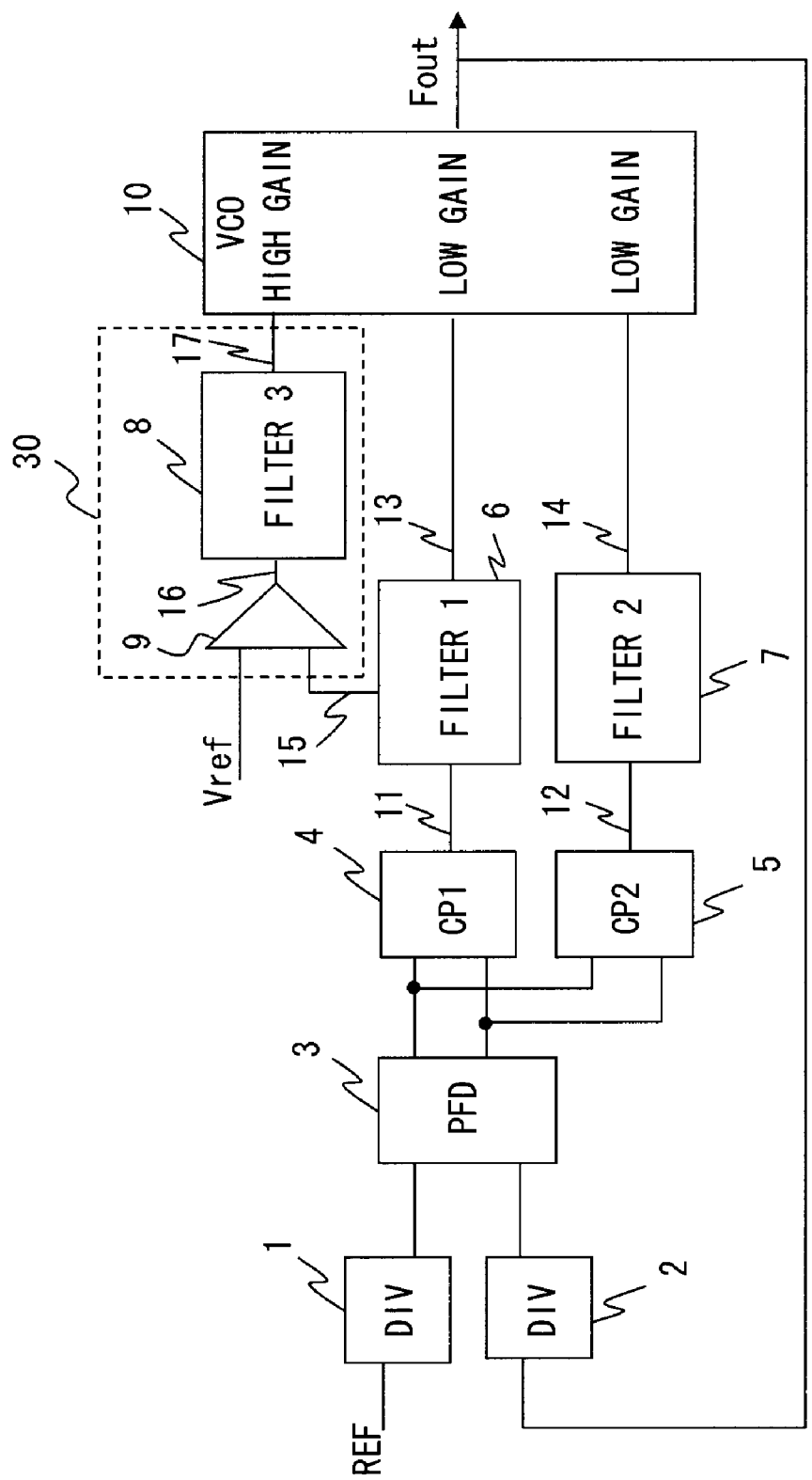
FIG. 1 is a block diagram illustrating a PLL circuit according to a first exemplary embodiment.

FIG. 1 is a block diagram illustrating a PLL circuit according to an exemplary embodiment. As illustrated in FIG. 1, the PLL circuit includes dividers 1, 2, a phase comparator 3, a first charge pump circuit 4, a second charge pump circuit 5, a first filter (filter 1) 6, a second filter (filter 2) 7, a third filter (filter 3) 8, a comparator 9, and a voltage controlled oscillator (VCO) 10. The comparator 9 and the third filter 8 constitute a voltage control unit 30.

The divider 1 divides a frequency of a reference signal REF and outputs the divided signal. The divider 1 divides a frequency of an output Fout of the voltage controlled oscillator and outputs the divided signal. The phase comparator 3 outputs a voltage-up signal and a voltage-down signal based on a phase difference between the output signal of the divider 1 and the output signal of the divider 2. The voltage-up signal and the voltage-down signal are, for example, pulse signals. If the output signal of the divider 1 has a phase delay relative to the output signal of the divider 2, a pulse width of the voltage-up signal is set longer than that of the voltage-down signal. On the other hand, if the output signal of the divider 2 has a phase ahead relative to the output signal of the divider 1, a pulse width of the voltage-up signal is set shorter than a pulse width of the voltage-down signal. Further, if the phase of the output signal of the divider 1 matches the phase of the output signal of the divider 2, a pulse width of the voltage-up signal is set equal to a pulse width of the voltage-down signal.

The first charge pump circuit 4 controls an output current based on the voltage-up signal and the voltage-down signal. For example, if a pulse width of the voltage-up signal is longer than a pulse width of the voltage-down signal, a current flows out during a period corresponding to a pulse width difference therebetween. For example, if the pulse width of the voltage-up signal is shorter than that of the voltage-down signal, a current flows in during a period corresponding to a pulse width difference between. An output of the first charge pump circuit 4 is output to the first filter 6 via a node 11.

Figure 3:
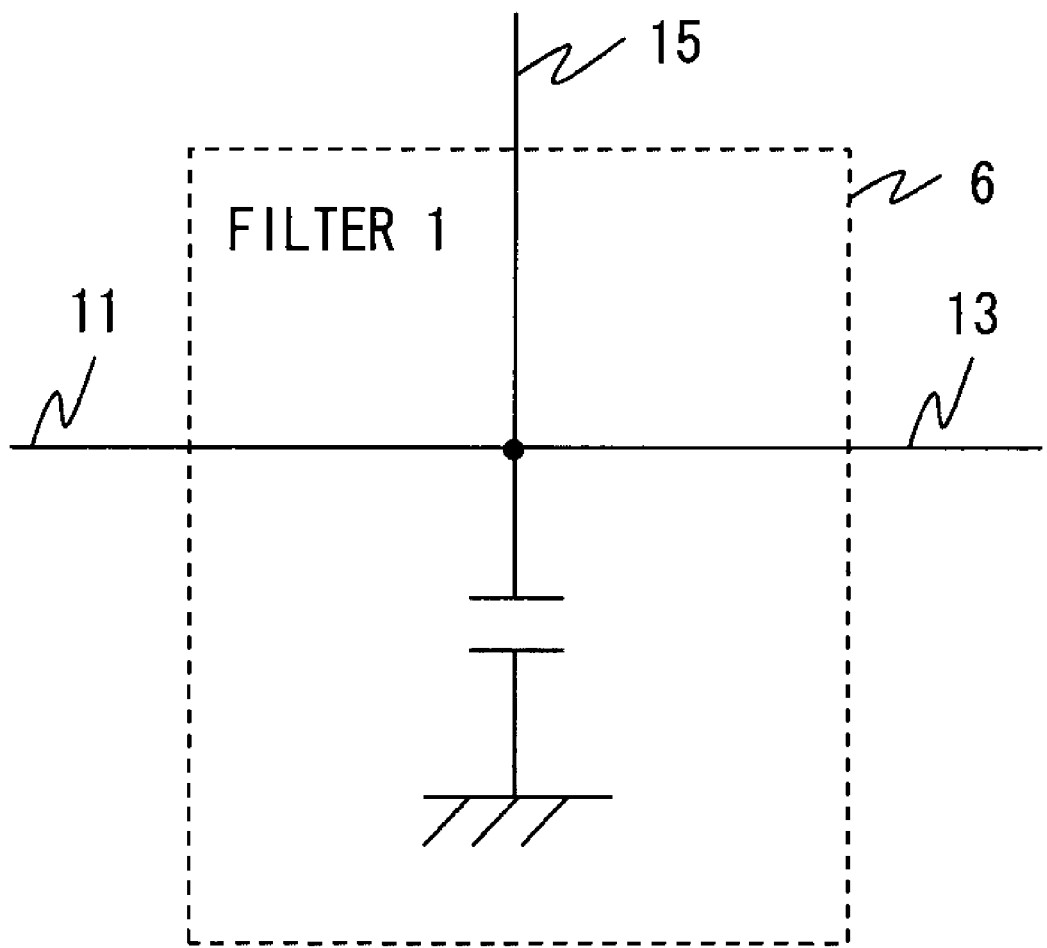
FIG. 3 illustrates an example of a filter 1 of the PLL circuit according to the first exemplary embodiment.

The first filter 6 filters out a signal including predetermined frequency components generated in accordance with the current output from the first charge pump circuit 4 (for example, high-frequency noise), and outputs as a first voltage signal. The first voltage signal output from the first filter 6 is output to one input of the comparator 9 via a node 15. The first voltage signal output from the first filter 6 is output to a low gain input of the voltage controlled oscillator 10 via a node 13. The first filter 6 can be constituted by providing a capacitor between the output (node 11) of the first charge pump circuit 4 and a ground voltage (GND), as illustrated in FIG. 3, for example.

The second charge pump circuit 5 controls an output current according to the voltage-up signal and the voltage-down signal. For example, if a pulse width of the voltage rise signal is longer than a pulse width of the voltage-down signal, a current flows out during a period corresponding to pulse width difference. Moreover, for example, if a pulse width of the voltage-up signal is shorter than the pulse width of the voltage-down signal, a current flows in during a period corresponding to the pulse width difference. An output of the second charge pump circuit 5 is output to the second filter 7 via a node 12.

The second filter 7 inputs the current output from the second charge pump circuit 5, and outputs a predetermined constant voltage as the second voltage signal. The second voltage signal, that is an output of the second filter 7, is output to the low gain input of the voltage controlled oscillator 10 via a node 14.

Figure 4A:
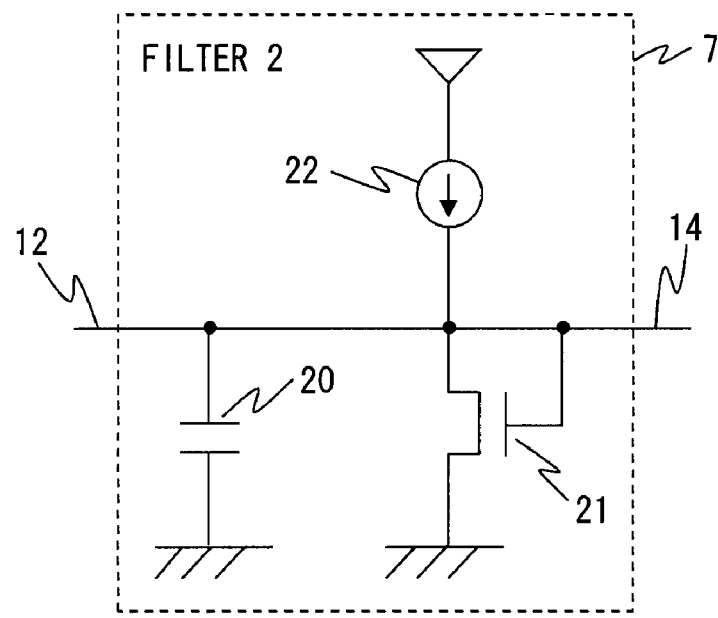
FIGS. 4A and 4B illustrate an example of a filter 2 of the PLL circuit according to the first exemplary embodiment.

As illustrated in FIG. 4A for example, the second filter 7 can be constituted of a capacitor 20, which is connected with a node 12 and the ground voltage (GND), an N-channel transistor 21 having a gate and a drain connected with the node 14 and a source connected with the ground voltage (GND), and a constant current source 22, which is connected with the node 14 and the power supply voltage.

At this time, a voltage of the node 14 stays at a predetermined constant voltage by using a mutual conductance (gm) of the N-channel transistor 21. Accordingly, the output of the filter 7 stays at a predetermined constant voltage. By using the transistor 21 which is diode connected with the current source 22 for the transistor 21, the filer will have small degradation in the Power Supply Rejection Ratio (PSRR) without using a differential configuration.

Figure 4B:
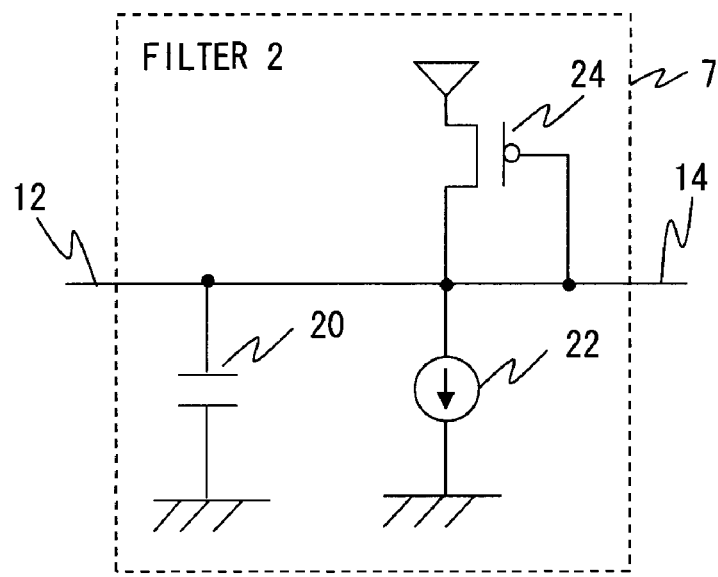

Further, as another configuration example of the second filter 7, as illustrated in FIG. 4B, the second filter 7 may be constituted of the capacitor 20 connected with the node 12 and the ground voltage (GND), a P-channel transistor 24 having a gate and a drain connected with the node 14 and a source connected with the power supply voltage, and the constant current source 22 connected with the node 14 and the ground voltage (GND).

Figure 5A:
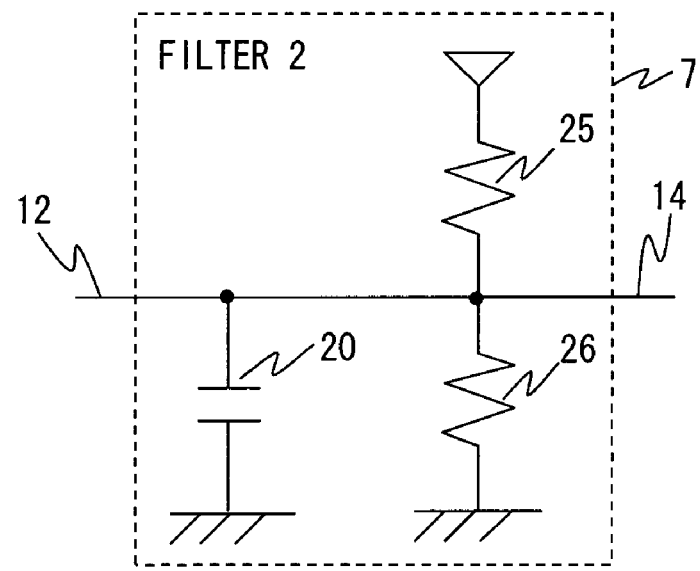
FIGS. 5A and 5B illustrate an example of the filter 2 of the PLL circuit according to the first exemplary embodiment.

As another configuration example of the second filter 7, as illustrated in FIG. 5A, the second filter 7 may be constituted of the capacitor 20, which is connected with the node 12 and the ground voltage (GND), a resistor 25, which is connected with the power supply voltage and the node 14, and a resistor 26, which is connected with the node 14 and the ground voltage (GND). However, for this configuration, it is desirable to provide two of the circuits and have a differential configuration, because the power supply noise sensibility is not favorable as compared with the filters of other configuration.

Figure 5B:
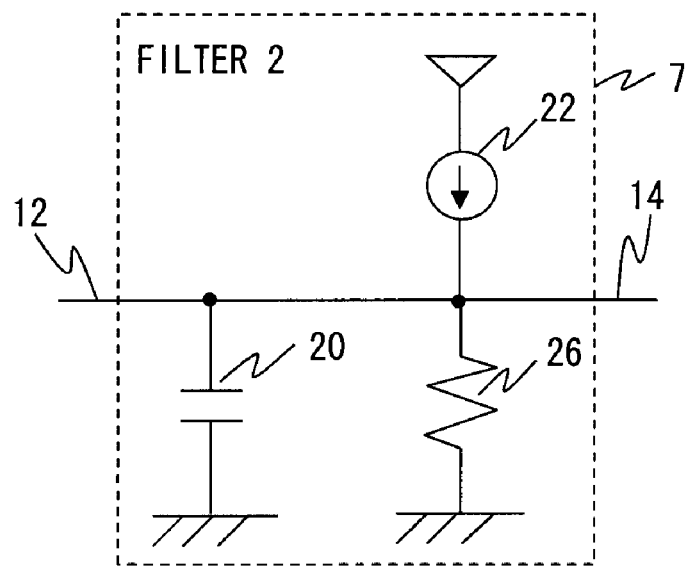

As another example of the second filer 7, as illustrated in FIG. 5B, the second filter 7 may be constituted of the capacitor 20, which is connected with the node 12 and the ground voltage (GND), the constant current source 22, which is connected with the power supply voltage and the node 14, and a resistor 26, which is connected with the node 14 and the ground voltage (GND).

Figure 6:
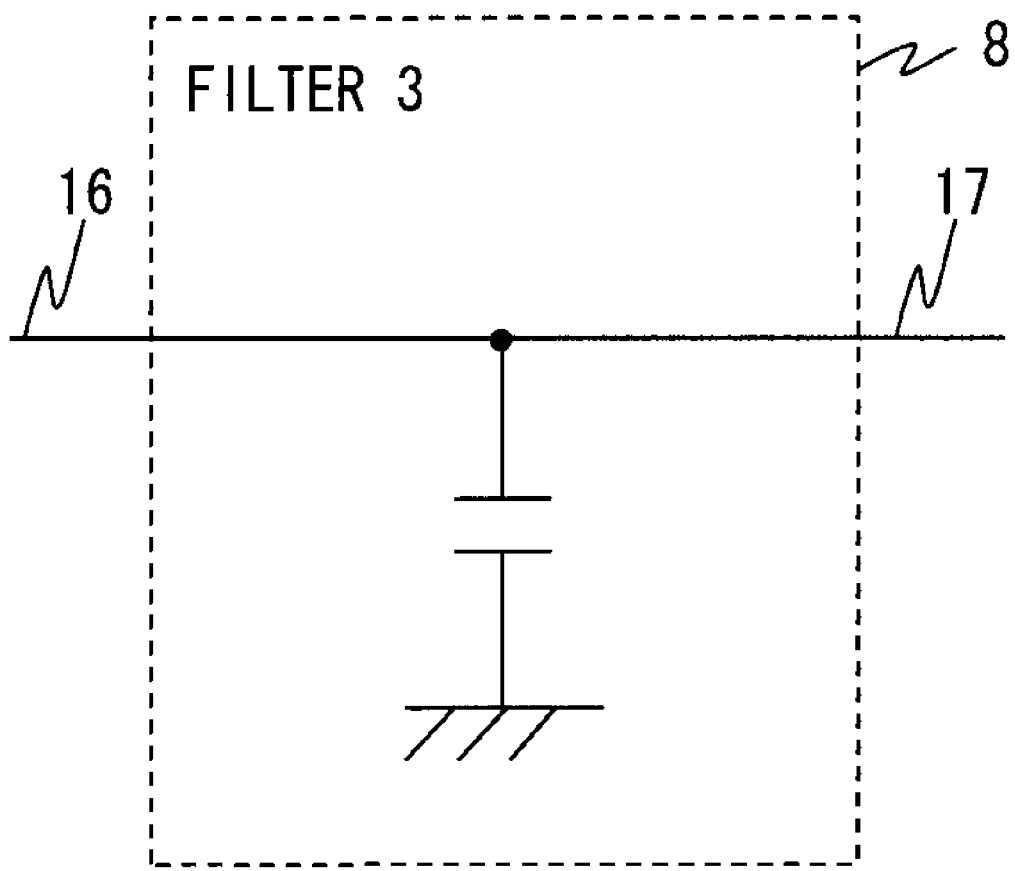
FIG. 6 illustrates an example of a filter 3 of the PLL circuit according to the first exemplary embodiment.

Next, the voltage control unit 30 is explained hereinafter. The third filter 8 that constitutes the voltage control unit 30 outputs a third voltage signal according to the comparison result between the first voltage signal of the first filter 6 and the reference voltage Vref. The comparator 9 compares the first voltage signal and the reference voltage Vref, and the comparison result is input to the third filter 8 via a node 16. The output of the third filter is output to a high gain input of the voltage controlled oscillator 10 via a node 17. The third filer 8 can be formed by the capacitor provided between the output (node 16) of the comparator 9 and the ground voltage (GND), as illustrated in FIG. 6 for example.

Figure 2:
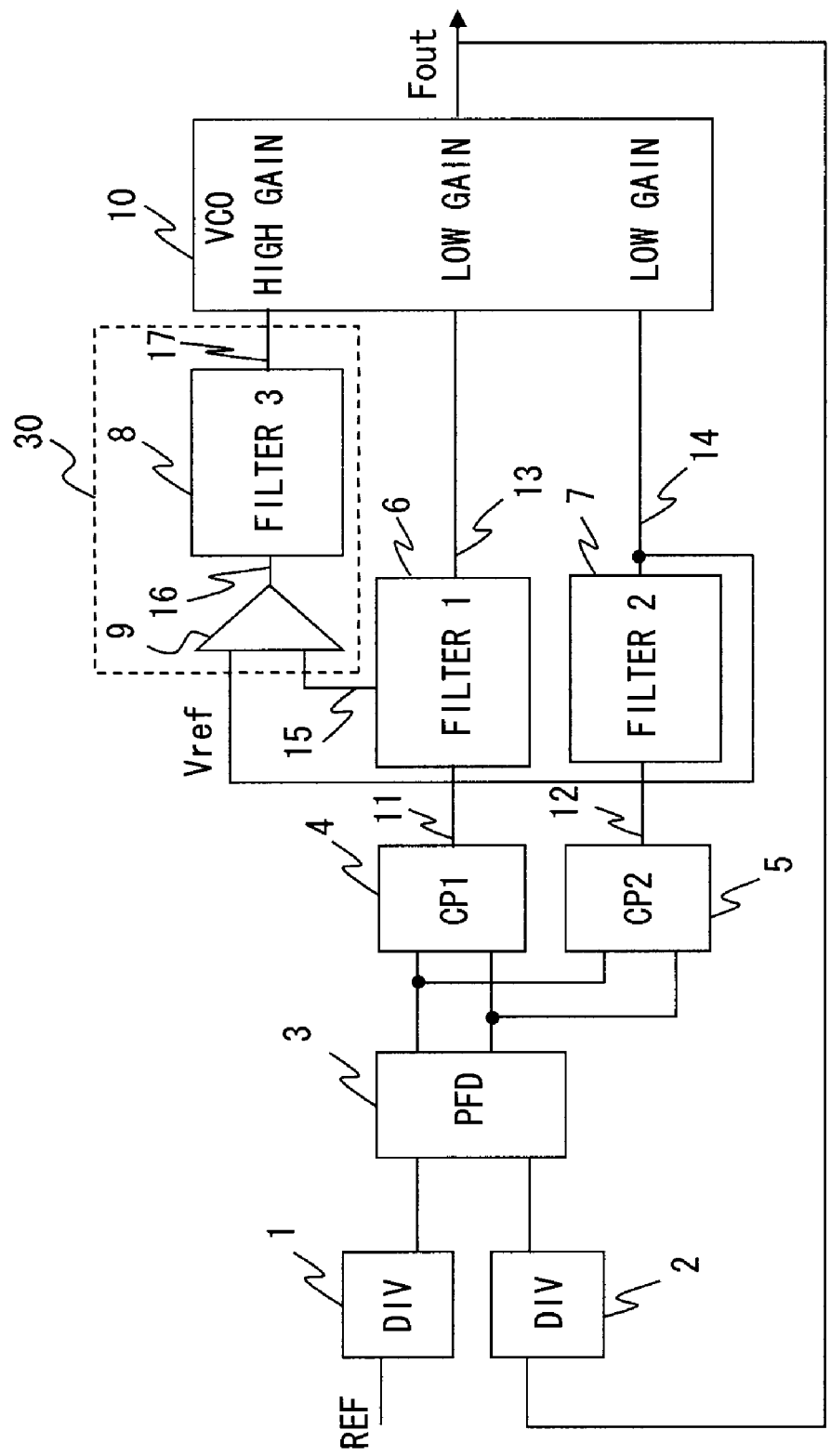
FIG. 2 is a block diagram illustrating the PLL circuit according to the first exemplary embodiment.

The reference voltage Vref can be the same as the predetermined constant voltage that is output from the second filter. For example, the output of the second filter 7 (constant voltage) can be used, as illustrated in FIG. 2. By using the output of the second filter 7 as the reference voltage Vref, the circuit which generates the reference voltage Vref can be eliminated, thereby simplifying the configuration of the PLL circuit. Note that the signs of the PLL circuit illustrated in FIG. 2 correspond to the signs of the PLL circuit illustrated in FIG. 1. The configuration and the operation of the PLL circuit illustrated in FIG. 2 also correspond to the configuration and the operation of the PLL circuit illustrated in FIG. 1.

Moreover, the voltage controlled oscillator (VCO) 10 has a first low gain property (i.e. a first low gain path), a second low gain property (i.e. a second low gain path), and a high gain property (i.e. a high gain path). The voltage controlled oscillator (VCO) 10 is controlled by the first voltage signal with the first low gain property, by the second voltage signal with the second low gain property, and by the third voltage signal with the high gain property, to generate an oscillating frequency according to the first to third voltage signals.

Then, the PLL circuit according to this exemplary embodiment feeds back the output signal Fout of the voltage controlled oscillator 10 to the phase comparator 3.

Next, the operation of the PLL circuit according to this exemplary embodiment is explained hereinafter. The PLL circuit divides the frequency of the reference signal REF by the divider 1. Further, the divider 2 divides the frequency of the output signal Fout. Then, the phase comparator 3 compares phases of the outputs of the dividers 1 and 2. The phase comparator 3 generates a voltage-up signal and a voltage-down signal according to the phase difference. The first charge pump circuit 4 and the second charge pump circuit 5 output a current according to a pulse width difference between the voltage-up signal and the voltage-down signal. If the pulse width of the voltage-up signal is longer than the pulse width of the voltage-down signal, the current output will be in a direction to be flown out of the charge pump circuit. Conversely, if the pulse width of the voltage-up signal is shorter than the pulse width of the voltage-down signal, the current will be in a direction to be flown into the charge pump circuit.

The current output from the first charge pump circuit 4 is converted into voltage by the first filter 6. At this time, the first filter 6 filters out high frequency noise generated by the operation of the first charge pump circuit 4. A voltage value converted by the first filter 6 increases if the output current of the first charge pump circuit 4 is in the outflow direction, and decreases if the output current is in the inflow direction. Then, the voltage value converted by the first filter 6 is output to the low gain input of the voltage controlled oscillator 10.

The comparator 9 compares the voltage value converted by the first filter 6 with the reference voltage Vref. Then, if the voltage from the first filter 6 is more than or equal to the reference voltage Vref, the comparator 9 outputs a signal. The third filter 8 outputs a voltage signal (third voltage signal) to the high gain input of the voltage controlled oscillator 10 based on the signal output from the comparator 9.

On the other hand, the current output from the second charge pump circuit 5 is converted into voltage via the second filter 7. Then, the second filter 7 outputs a predetermined constant voltage to the low gain input of the voltage controlled oscillator 10.

FIG. 7 illustrates the relationship between time and control voltage, time and frequency, and time and phase difference of the voltage controlled oscillator 10 of the PLL circuit according to this exemplary embodiment. The first filter (filter 1) 6 outputs the first voltage signal as a control voltage, the second filter (filter 2) 7 outputs the second voltage signal as a control voltage, and the third filter (filter 3) 8 outputs the third voltage signal as a control voltage.

In the PLL circuit according to this exemplary embodiment, the frequency when the PLL circuit is locked shall be Fpll, as illustrated in FIG. 7B. Moreover, as illustrated in FIG. 7A, from the timing T5 when the PLL circuit is locked, the control voltage from the filter 1 and the control voltage from the filter 2 are both the reference voltage Vref. Furthermore, the control voltage from the filter 3 is set to the predetermined constant voltage.

As illustrated in FIG. 7A, when the PLL circuit starts up, the control voltage from the filter 2 gradually increases and reaches the voltage Vref, which is previously specified as the output voltage of the filter 2 at the timing T1. At this time, the oscillation frequency of the PLL circuit increases gradually with a lower frequency than the frequency Fpll at the time the PLL circuit is locked.

At the time of the PLL circuit start up, the control voltage from the filer 1 gradually increases, reaches near the power supply voltage at the timing T3, and then stays constant. At this time, the oscillation frequency of the PLL circuit increases gradually with a lower frequency than the frequency Fpll at the time the PLL circuit is locked. Although the oscillation frequency of the PLL circuit has reached Fpll at the timing T3, the PLL circuit is not officially locked at this timing, thus the phase difference is large, for example, and the PLL circuit is not properly locked. Note that the circuit may be designed not to reach Fpll at the timing T3 and may be set to a clear unlocked state.

The control voltage from the filter 1 is compared with the reference voltage Vref using the comparator 9 illustrated in FIG. 1. The control voltage from the filter 3 gradually increases at the timing T2 when the control voltage from the filter 1 exceeds the reference voltage Vref, and the high gain path of the voltage controlled oscillator 10 starts to operate. That is, the voltage controlled oscillator 10 of the PLL circuit has been operating only with the low gain path till T2, however the voltage controlled oscillator 10 operates with both the low and the high gain paths from T2.

Then, the filter 3 outputs the control voltage to the high gain input of the voltage controlled oscillator 10 from T2, so that the control voltage from the filter 1 becomes the same as the reference voltage Vref, which is the control voltage when the PLL is locked. On the other hand, the filters 1 and 2 output the control voltage to the low gain input of the voltage controlled oscillator 10 to reduce the phase difference of the PLL circuit to 0.

Figure 8A:
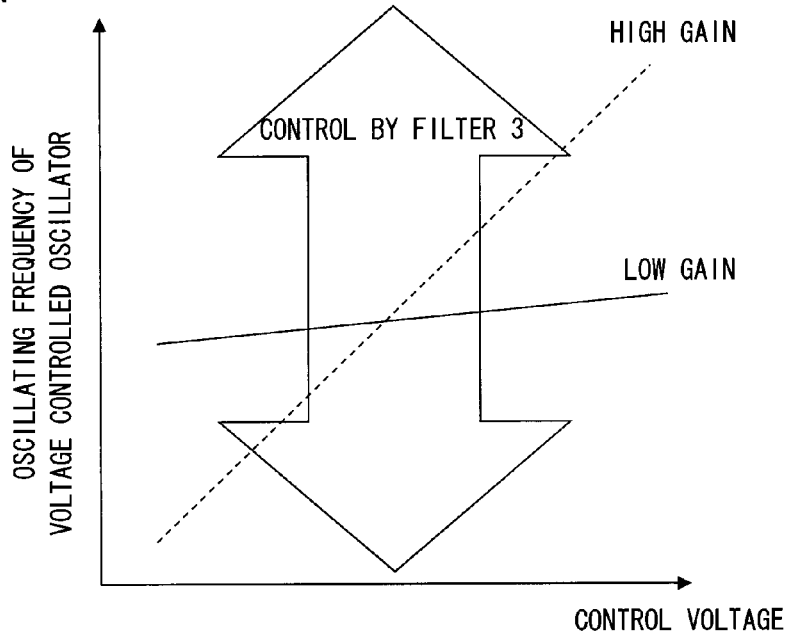
FIGS. 8A and 8B explain a voltage controlled oscillator (VCO) of the PLL circuit according to the first exemplary embodiment.

The operation at this time is explained with reference to FIG. 8A. FIG. 8A illustrates the relationship between the control voltage and the oscillation frequency of the voltage controlled oscillator 10. As illustrated in FIG. 8A, in the low gain path, a change in the oscillation frequency of the voltage controlled oscillator 10 is small for a change in the control voltage (that is, the slope of the graph is small). On the other hand, in the high gain path, the change in the oscillation frequency of the voltage controlled oscillator 10 is large for the change in the control voltage (that is, the slope of the graph is large). Accordingly, if the oscillation frequency is changed using the voltage controlled oscillator 10, the oscillation frequency can be set to the target frequency (Fpll) quicker when using the high gain path.

In the PLL circuit according to this exemplary embodiment, the filter 3 outputs the control voltage to the high gain path of the voltage controlled oscillator 10, so that the oscillation frequency output from the voltage controlled oscillator 10 will be the target frequency (Fpll). Moreover, at the same time, the filters 1 and 2 output the control voltage to the low gain path of the voltage controlled oscillator 10 to reduce the phase difference of the PLL circuit to 0.

At this time, the operations in the high and the low gain paths of the voltage controlled oscillator 10 are independent from each other. The high gain path adjusts the voltage, and the low gain path adjusts phases as PLL. However, the total current value inside the voltage controlled oscillator 10 supplied based on the control voltages of each of the filters 1, 2, and 3 is constant, thus the distribution of the low gain operation and the high gain operation is changed inside the voltage controlled oscillator 10.

Then, the control voltage from the filter 1 starts to decrease to be close to the reference voltage Vref, and becomes the same as the reference voltage Vref at the timing T5. At this time, as illustrated in FIG. 7C, the phase difference between the output Fout from the voltage controlled oscillator 10 and REF input to the divider 1 starts to decrease, and becomes 0 at the timing T5. From the timing T5, the PLL circuit is locked, and both of the control voltages from the filters 1 and 2 stay constant at the reference voltage Vref. Further, the control voltage from the filter 3 is set constant at the predetermined voltage.

The voltage controlled oscillator 10 operates with both the low gain path and the high gain path from the timing T5. In the PLL circuit according to this exemplary embodiment, when the voltage of the filter 1 gets close to the reference voltage Vref, the low gain path becomes dominant, and no influence of the high gain path is affected. Thus the PLL circuit operates with the low gain path when locked. At this time, the high gain path is responsible for generating a fixed offset frequency.

Figure 8B:
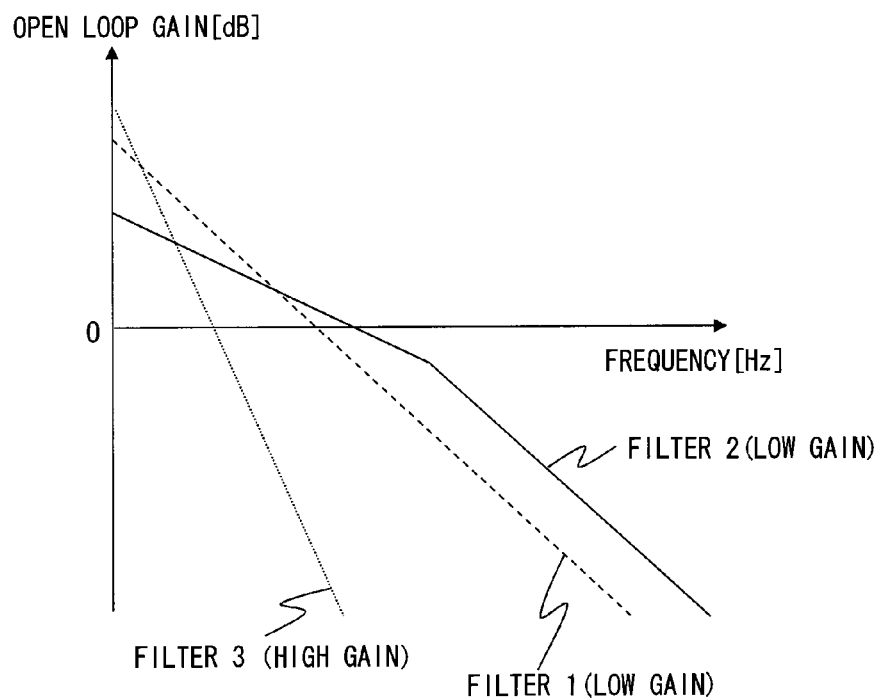

FIG. 8B illustrates the relationship between the frequency of the output signal of each filter and an open loop gain in the voltage controlled oscillator 10 of the PLL circuit according to this exemplary embodiment. As illustrated in FIG. 8B, in the voltage controlled oscillator 10 of the PLL circuit according to this exemplary embodiment, a band of the filter 3 is made smaller than bands of the filters 1 and 2. Moreover, by adjusting each DC gain to optimal value, it is possible to prevent cycle slips from occurring at the time of adjusting the current distribution to the high gain path and the low gain path of the voltage controlled oscillator 10 in the lockup process. Further, the high gain path (path of the filter 3) can be ignored while the PLL circuit is locked.

Therefore, in the PLL circuit according to this exemplary embodiment, the gain of the voltage controlled oscillator 10 can be made small while the PLL circuit is locked, thus the sensibility to the control voltage can be made small. This enables to reduce the noise sensibility of the voltage controlled oscillator 10 while the PLL circuit is locked. Moreover, the PLL circuit according to this exemplary embodiment is provided with the first and second charge pump circuits 4, 5 to operate the first and second filters 6, 7 with different currents. This reduces the capacitance value of the capacitor that constitutes the first filter 6, thereby reducing the area of the PLL circuit. The PLL circuit according to this exemplary embodiment not only realizes the capacity reduction with different currents, but may realizes capacity reduction with different gains or may combine the current and the gain.

Figure 14:
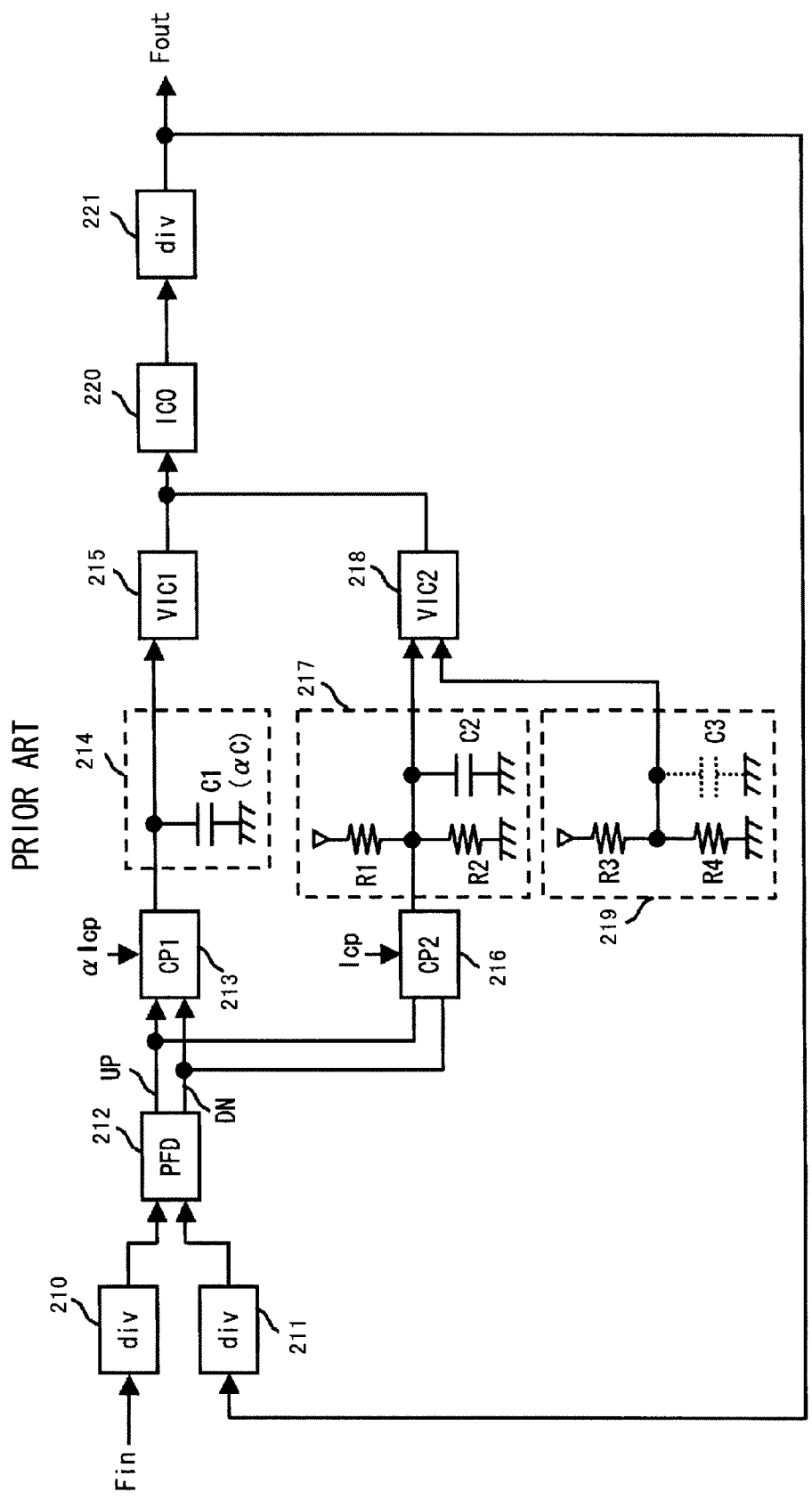
FIG. 14 is a block diagram illustrating a PLL circuit disclosed in Japanese Unexamined Patent Application Publication No. 2008-48320.

Furthermore, the PLL circuit disclosed in Japanese Unexamined Patent Application Publication No. 2008-48320, which is illustrated in FIG. 14, is provided with the path that passes through the first charge pump 213, the integrating filter 214, and the first voltage-current converting circuit 215, and the path that passes through the second charge pump circuit 216, the ripple filter 217, and the second voltage-current converting circuit 218. Thus it has been difficult to match the gain of the two paths. However, in the PLL circuit according to this exemplary embodiment, the output voltages of the first filter 6 and the second filter 7 are set to be the same when the PLL circuit is locked. This enables to realize the voltage controlled oscillator (VCO) 10 with a fixed control voltage and also the voltage controlled oscillator 10 to operate stably.

Second Exemplary Embodiment

Figure 9:
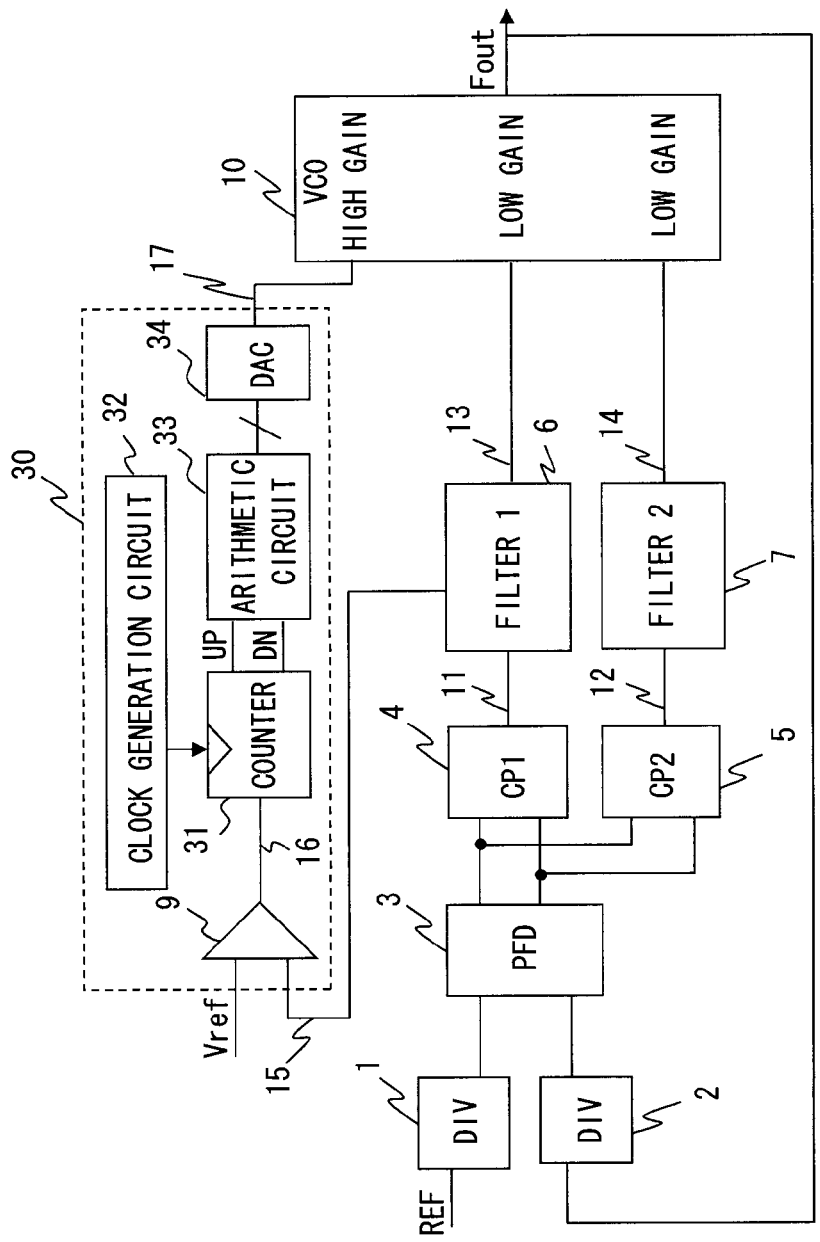
FIG. 9 is a block diagram illustrating a PLL circuit according to a second exemplary embodiment.

Next, a second exemplary embodiment of the present invention is explained hereinafter. FIG. 9 is a block diagram illustrating the circuit configuration of the PLL circuit according to this exemplary embodiment. As illustrated in FIG. 9, a difference of the PLL circuit according to this exemplary embodiment from the first exemplary embodiment is the configuration of the voltage control unit 30 that generates the third voltage signal supplied to the high gain input of the voltage controlled oscillator (VCO) 10. Other configuration is the same as the first exemplary embodiment, thus the repeated explanation is omitted.

The voltage control unit 30 of the PLL circuit according to this exemplary embodiment includes a comparator 9, a counter 31, a clock generation circuit 32, an arithmetic circuit 33, and a digital-to-analog converter (hereinafter referred to as DAC) 34.

The comparator 9 compares the reference voltage Vref with the first voltage signal supplied from the first filter 6 via the node 15, and outputs the comparison result to the counter 31 via the node 16. If the first voltage signal is more than or equal to the reference voltage Vref, for example, the comparator 9 outputs "1". If the first voltage signal is smaller than the reference voltage Vref, the comparator 9 outputs "0".

The counter 31 generates a counter value according to clocks supplied from the clock generation circuit 32. If the output of the comparator 9 is "1", for example, the counter 31 outputs "1" at the timing when the clock rises from the clock generation circuit 32. Here, "1" indicates count-up (UP). On the other hand, if the output of the comparator 9 is "0", the counter 31 outputs "0" at the timing when the clock rises from the clock generation circuit 32. Here, "0" indicates count-down (DN). The output from the counter 31 is supplied to the arithmetic circuit 33.

Figure 10A:
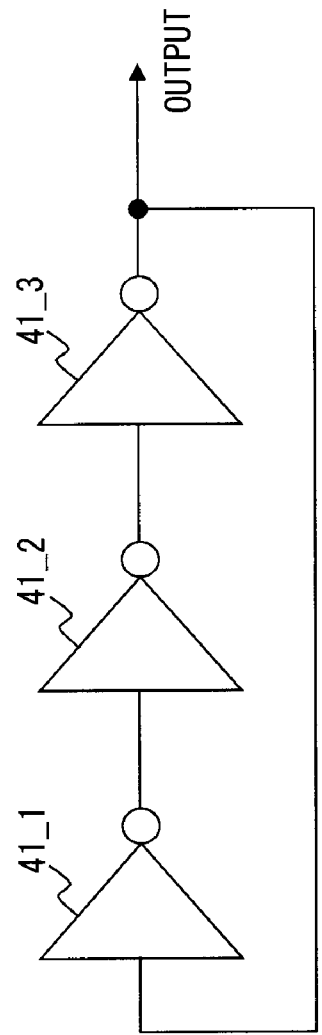
FIGS. 10A and 10B illustrate an example of a clock generation circuit of the PLL circuit according to the second exemplary embodiment.
Figure 10B:
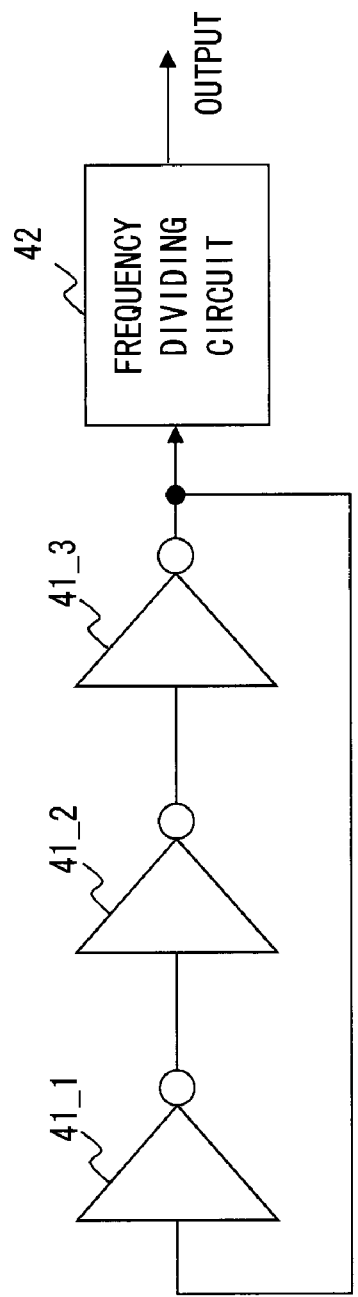

As illustrated in FIG. 10A, for example, the clock generation circuit 32 may be constituted of a ring oscillator that includes odd number of inverters 41_1 to 41_3 (3 stages in the case of FIG. 10A). As illustrated in FIG. 10B, for example, the clock generation circuit 32 may also be constituted of odd number of the inverters 41_1 to 41_3, and a frequency dividing circuit 42 in the subsequent stage thereof.

The arithmetic circuit 33 calculates a control code to be supplied to the DAC 34 according to the count value supplied from the counter 31. That is, the arithmetic circuit 33 adds if the output from the counter 31 is "1", and subtracts if the output from the counter 31 is "0".

The DAC 34 generates the third voltage signal according to the control code from the arithmetic circuit 33. Then, the third generated voltage signal is supplied to the high gain input of the voltage controlled oscillator 10 via the node 17.

The PLL circuit according to the present invention must be designed in a way that the high gain path (voltage control unit) is in a lower band than the low gain path. Thus the voltage control unit 30 must be composed with an extremely low band low pass filter. Although it is also possible to constitute the voltage control unit 30 by the comparator 9 and the third filer 8 in an analog manner as in the first exemplary embodiment, however this increases the circuit area and it is not easy to dynamically change the characteristics. That is, in order to achieve low band, the voltage control unit 30 of the PLL circuit according to the first exemplary embodiment needs to reduce the gain of the capacitor 9 (that is, reduce the output current) and increase the capacity for the third filter 8 as the capacitance is used for the third filter 8. Therefore, it is easily influenced by a leakage current, and a circuit area also increases.

The PLL circuit according to this exemplary embodiment can solve such problem by the above configuration of the voltage control unit 30. That is, the voltage control unit 30 of the PLL circuit according to this exemplary embodiment can increase the output current of the comparator 9, and also the output current of the DAC 34 can be specified to the extent to ignore the leak current. Thus the influence of the leak current can be reduced.

As the voltage control unit 30 of the PLL circuit according to this exemplary embodiment controls the band by the counter value or the like of a digital circuit for monitoring the output result of the comparator 9. Thus the band can be controlled without changing the gain of the comparator 9 or the capacity of the third filter 8. This enables to achieve lower band without increasing the circuit area of the voltage control unit 30.

Moreover, the voltage control unit 30 of the PLL circuit according to this exemplary embodiment controls the band using a digital circuit, thus the band can be dynamically changed by changing the count value or the like. Furthermore, the voltage control unit 30 of the PLL circuit according to this exemplary embodiment counts clocks using the counter 31, thus has time information. Therefore, the voltage control unit 30 can freely specify the value of the third voltage signal. Accordingly, for example, it is possible to lock at a high speed when the PLL circuit starts up, and operate at a low speed after the PLL circuit is locked.

Third Exemplary Embodiment

Figure 11:
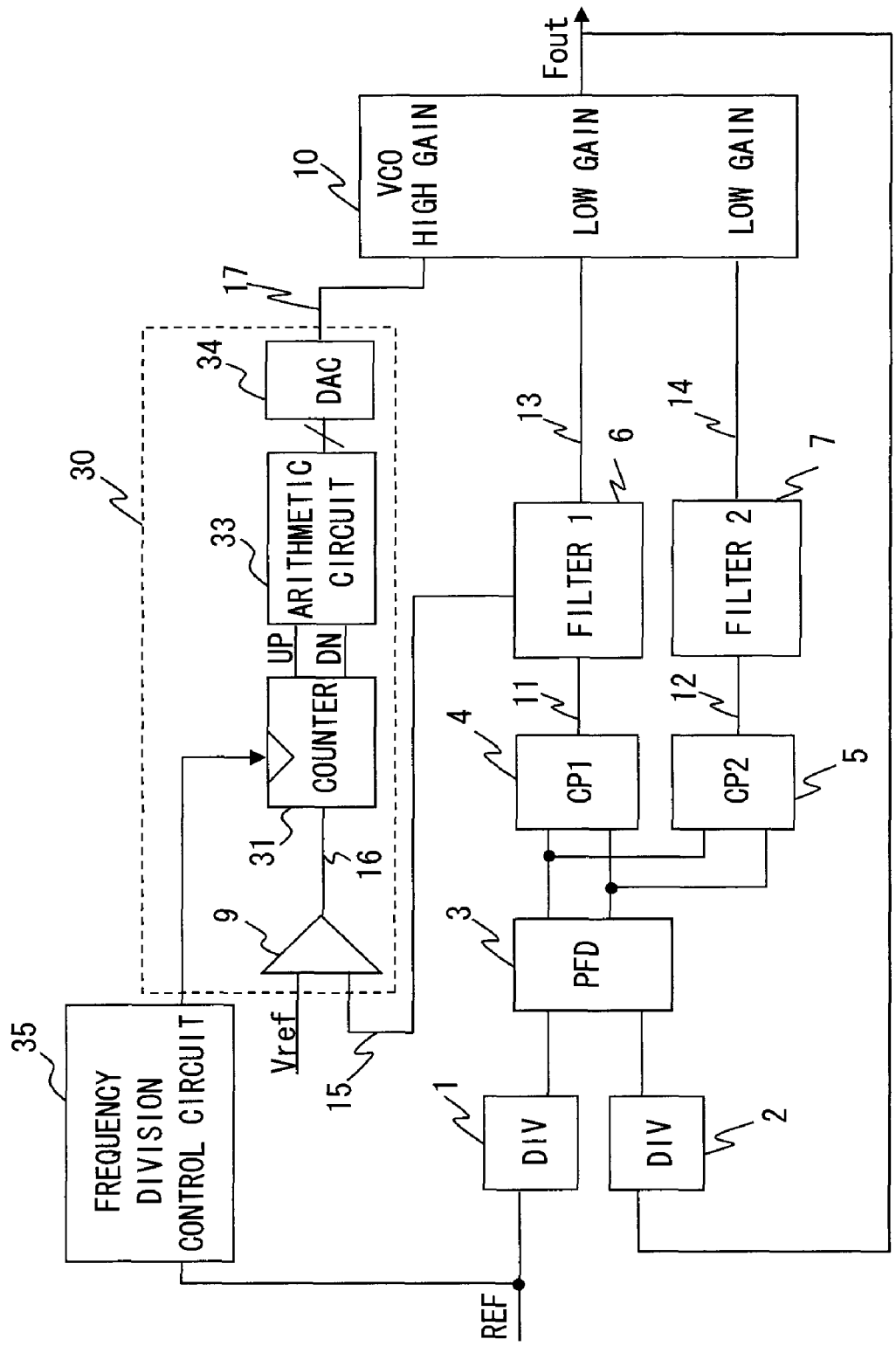
FIG. 11 is a block diagram illustrating a PLL circuit according to a third exemplary embodiment.
Figure 12:
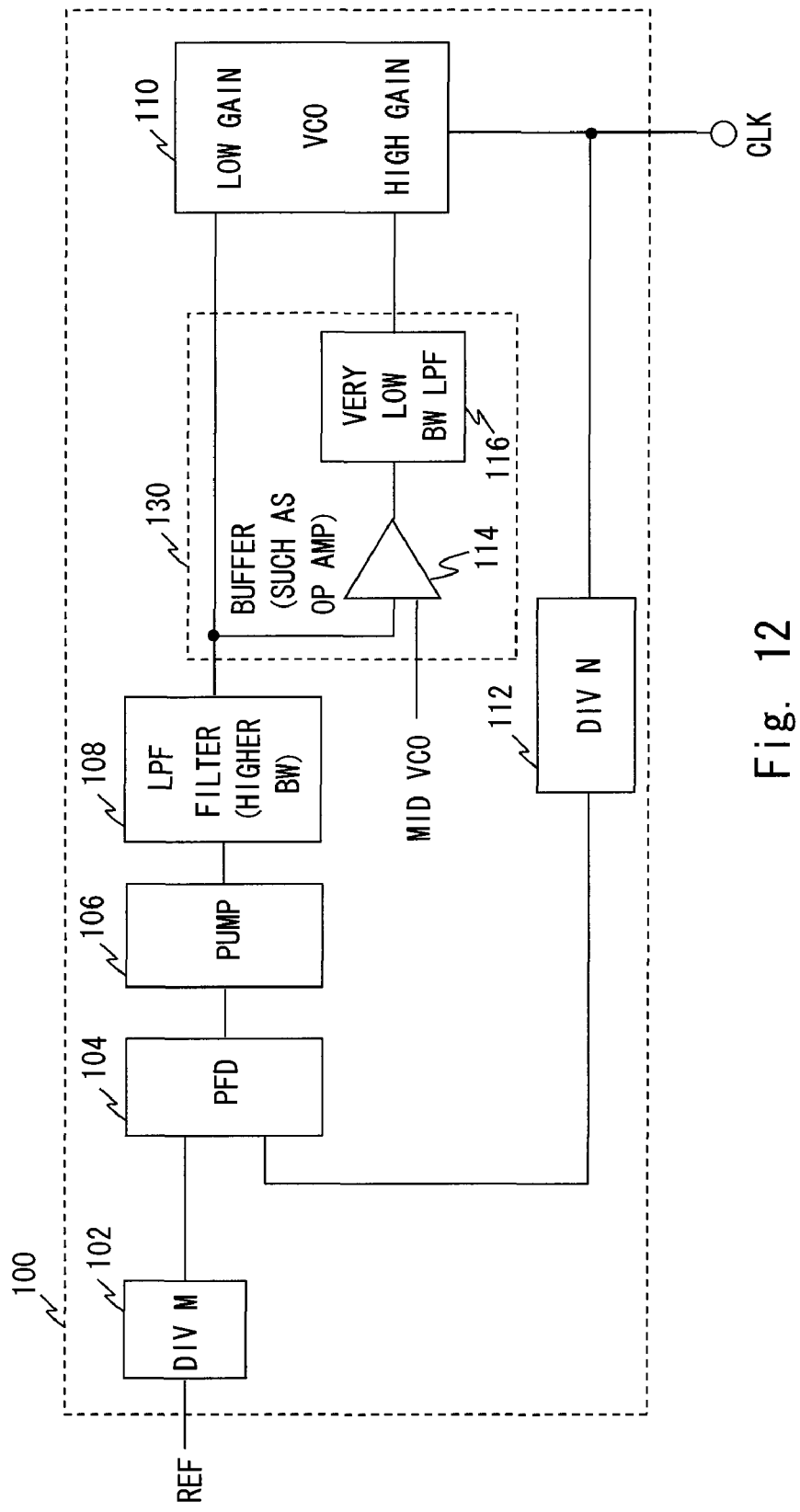
FIG. 12 is a block diagram illustrating a PLL circuit disclosed in U.S. Pat. No. 6,680,632.
Figure 13:
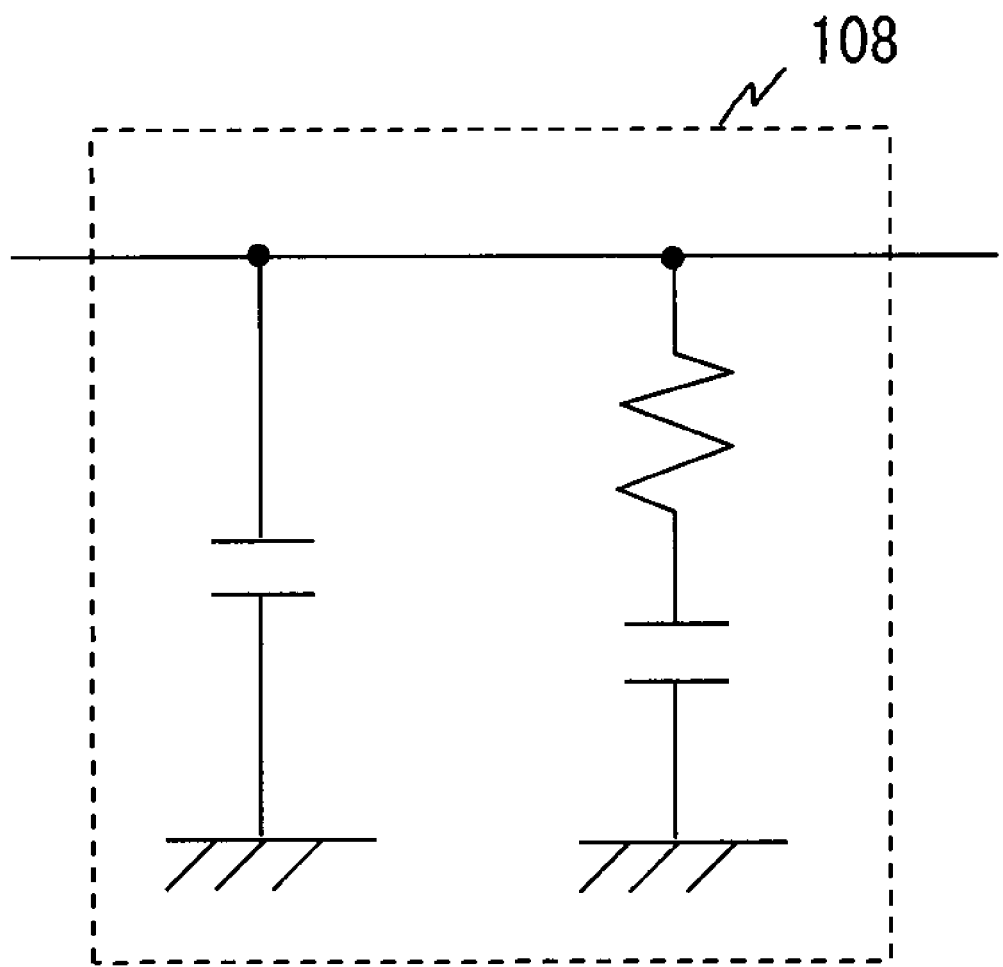
FIG. 13 illustrates a filter of a PLL circuit according to a related art.

Next, a third exemplary embodiment of the present invention is explained hereinafter. FIG. 11 is a block diagram illustrating the circuit configuration of a PLL circuit according to this exemplary embodiment. As illustrated in FIG. 11, the PLL circuit according to this exemplary embodiment is different from the second exemplary embodiment in that the clock REF input to the divider 1 (that is, a clock input to a phase comparator) is used as a clock to input to the counter 31 of the voltage control unit 30. The PLL circuit according to the exemplary embodiment can adjust the frequency of the clock input to the counter 31 by controlling the clock REF input to the divider 1 by the division control circuit 35. Other configuration is the same as the second exemplary embodiment, thus the repeated explanation is omitted.

In the second exemplary embodiment, the ring oscillator illustrated in FIG. 10 generates clocks, however in this case, it is sometimes difficult to control externally as the oscillation frequency depends on the process. However, the voltage control unit 30 in the PLL circuit according to this exemplary embodiment uses the clock REF input to the divider 1, as the clock input to the counter 31. Therefore, since the frequency of the clock REF input to the divider 1 is already known, it is easier to grasp the time interval by the voltage control unit 30. This enables to link the clock REF to easily control the frequency characteristic of the voltage control unit 30 automatically.

Further, as it is not necessary to provide the clock generation circuit as in the second exemplary embodiment, it is possible to reduce the circuit area and thereby reducing the power consumption.

The first and second exemplary embodiments, the first and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A PLL circuit comprising:
    first and second charge pump circuits that control an output voltage according to an output signal of a phase comparator;
    a first filter that filters out a predetermined frequency component included in a signal generated according to a current output from the first charge pump circuit, and outputs the signal as a first voltage signal;
    a second filter that inputs a current output from the second charge pump circuit and outputs a predetermined constant voltage as a second voltage signal;
    a voltage control unit that outputs a third voltage signal according to a comparison result between the first voltage signal and a reference voltage signal, the first voltage signal being output from the first filter; and
    a voltage controlled oscillator that has a first low gain property, a second low gain property, and a high gain property, and is controlled by the first voltage signal with the first low gain property, by the second voltage signal with the second low gain property, and by the third voltage signal with the high gain property, to generate an oscillating frequency according to the first to third voltage signals,
    wherein the PLL circuit feeds back an output signal of the voltage controlled oscillator to the phase comparator.

2. The PLL circuit according to claim 1, wherein the reference voltage to be compared with the first voltage signal is same as the predetermined constant voltage output from the second filter.

3. The PLL circuit according to claim 1, wherein the second filter comprises:
    a capacitor provided between an input terminal and a ground voltage, the input terminal being connected with the second charge pump circuit; and
    an N-channel transistor having a gate and a drain connected with an output terminal to the voltage controlled oscillator, and a source connected with a ground voltage.

4. The PLL circuit according to claim 1, wherein the oscillating frequency of the PLL circuit is determined by the second voltage signal.

5. The PLL circuit according to claim 1, wherein the voltage controlled oscillator is operated with the high gain property according to a comparison result between a voltage of the first voltage signal and a voltage of the second voltage signal.

6. The PLL circuit according to claim 5, wherein if the voltage of the first voltage signal is more than or equal to the voltage of the second voltage signal, the voltage controlled oscillator is operated with the high gain property.

7. The PLL circuit according to claim 1, wherein a third voltage signal is a voltage signal including a target frequency for the oscillating frequency output from the voltage controlled oscillator.

8. The PLL circuit according to claim 1, wherein the first and second voltage signals are a voltage signal to reduce a difference between a phase of the reference signal and a phase of the output signal of the voltage controlled oscillator to 0, the difference being compared by the phase comparator.

9. The PLL circuit according to claim 1, wherein if the PLL circuit is locked, the voltage of the first voltage signal and the voltage of the second voltage signal are the reference voltage.

10. The PLL circuit according to claim 1, wherein if the PLL circuit is locked, the first and the second low gain properties of the voltage controlled oscillator are dominant.

11. The PLL circuit according to claim 1, wherein the voltage control unit comprises:
    a comparator that compares the first voltage signal with the reference signal, the first voltage signal being output from the first filter; and
    a third filter that generates the third voltage signal according to an output of the comparator.

12. The PLL circuit according to claim 1, wherein the voltage control unit comprises:
    a comparator that compares the first voltage signal with the reference signal, the first voltage signal being output from the first filter;
    a counter that outputs a comparison result of the comparator according to a clock;
    an arithmetic circuit that calculates an output of the counter; and
    a digital-to-analog converter that generates the third voltage signal according to a calculation result of the arithmetic circuit.

13. The PLL circuit according to claim 12, further comprising a clock generation circuit that generates a clock to be input to the counter.

14. The PLL circuit according to claim 12, wherein the clock to be input to the counter is generated using a clock to be input to the phase comparator.

15. The PLL circuit according to claim 14, further comprising a frequency division control circuit that inputs the clock to be input to the phase comparator and adjusts a frequency of the clock, wherein
    the counter inputs the clock adjusted by the frequency division control circuit.

* * * * *